United States Patent
Abe et al.

(10) Patent No.: US 8,981,617 B2
(45) Date of Patent: Mar. 17, 2015

(54) ACTUATOR APPARATUS, TEST APPARATUS, AND TEST METHOD

(75) Inventors: Yoshikazu Abe, Miyagi (JP); Hisao Hori, Miyagi (JP); Yoshihiro Sato, Miyagi (JP)

(73) Assignee: Advantest Corporation, Tokyo (JP)

( * ) Notice: Subject to any disclaimer, the term of this patent is extended or adjusted under 35 U.S.C. 154(b) by 224 days.

(21) Appl. No.: 13/530,114

(22) Filed: Jun. 22, 2012

(65) Prior Publication Data

US 2013/0285505 A1    Oct. 31, 2013

(30) Foreign Application Priority Data

Apr. 25, 2012  (JP) .................................. 2012-099774

(51) Int. Cl.
*H02N 2/00* (2006.01)
*H01H 57/00* (2006.01)
*H01L 41/04* (2006.01)

(52) U.S. Cl.
CPC ............. *H02N 2/0075* (2013.01); *H01H 57/00* (2013.01); *H01L 41/042* (2013.01); *H01H 2057/006* (2013.01)
USPC .......................................... 310/317; 310/328

(58) Field of Classification Search
CPC ................................. H01L 41/042; H02N 2/025
USPC .................................................. 310/317, 328
See application file for complete search history.

(56) References Cited

U.S. PATENT DOCUMENTS

| | | | | |
|---|---|---|---|---|
| 5,212,497 | A * | 5/1993 | Stanley et al. | 347/19 |
| 6,204,811 | B1 * | 3/2001 | Phillips | 342/372 |
| 6,674,563 | B2 * | 1/2004 | Chui et al. | 359/291 |
| 7,019,436 | B2 * | 3/2006 | Rueger et al. | 310/316.03 |
| 2002/0175594 | A1 * | 11/2002 | Kornbluh et al. | 310/317 |
| 2003/0094882 | A1 * | 5/2003 | Mizuuchi | 310/317 |
| 2005/0104475 | A1 * | 5/2005 | Kataoka | 310/317 |
| 2009/0085432 | A1 * | 4/2009 | Liu | 310/317 |

FOREIGN PATENT DOCUMENTS

| | | |
|---|---|---|
| JP | H09-182466 A | 7/1997 |
| JP | 2001-133473 A | 5/2001 |
| JP | 2002-4924 A | 1/2002 |
| JP | 2008-253077 A | 10/2008 |
| JP | 2010-4104 A | 1/2010 |
| JP | 2011-187680 A | 9/2011 |

OTHER PUBLICATIONS

Office Action for Japanese Patent Application No. 2012-099774, issued by the Japanese Patent Office on Feb. 4, 2014.

* cited by examiner

*Primary Examiner* — Derek Rosenau
*Assistant Examiner* — Bryan Gordon

(57) ABSTRACT

Provided is an actuator apparatus including: an actuator that is provided with a driving voltage at one end and a reference potential at the other end to enable driving; a first setting section that is connected to the one end of the actuator and sets an operating speed of the actuator; a second setting section that is provided between the one end of the actuator and the reference potential, and sets the driving voltage of the actuator.

14 Claims, 13 Drawing Sheets

US 8,981,617 B2

ACTUATOR APPARATUS, TEST APPARATUS, AND TEST METHOD

BACKGROUND

1. Technical Field

The present invention relates to an actuator apparatus, a test apparatus, and a test method.

2. Related Art

A voltage driving device such as an actuator having a piezoelectric film conventionally operates according to a controlling voltage provided from outside (e.g., refer to Patent Documents No. 1-No. 3).

Patent Document No. 1: Japanese Patent Application Publication No. 2010-4104

Patent Document No. 2: Japanese Patent Application Publication No. 2011-187680

Patent Document No. 3: Japanese Patent Application Publication No. 2002-4924

However, in a device such as an actuator having a movable section, it is hard to produce the movable section with accuracy and favorable reproducibility in a predetermined arrangement. If a plurality of movable sections are produced, each will be formed with a default displacement amount. This calls for individual adjustment of controlling voltage for controlling the position in such an actuator.

SUMMARY

To solve the above problems, according to an aspect related to the innovations herein, provided are an actuator apparatus, a test apparatus, and a test method that can solve the above-mentioned problems. This is achieved by the combination of the features recited in the claims. According to a first aspect related to the innovations herein, provided is an actuator apparatus including: an actuator that is provided with a driving voltage at one end and a reference potential at the other end to enable driving; a first setting section that is connected to the one end of the actuator and sets an operating speed of the actuator; and a second setting section that is provided between the one end of the actuator and the reference potential, and sets the driving voltage of the actuator.

According to a second aspect related to the innovations herein, provided is a test method for testing an actuator, including: measuring correspondence between the driving voltage of the actuator and electric connection between a first contact and a second contact; and determining a circuit for the second setting section according to the correspondence.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
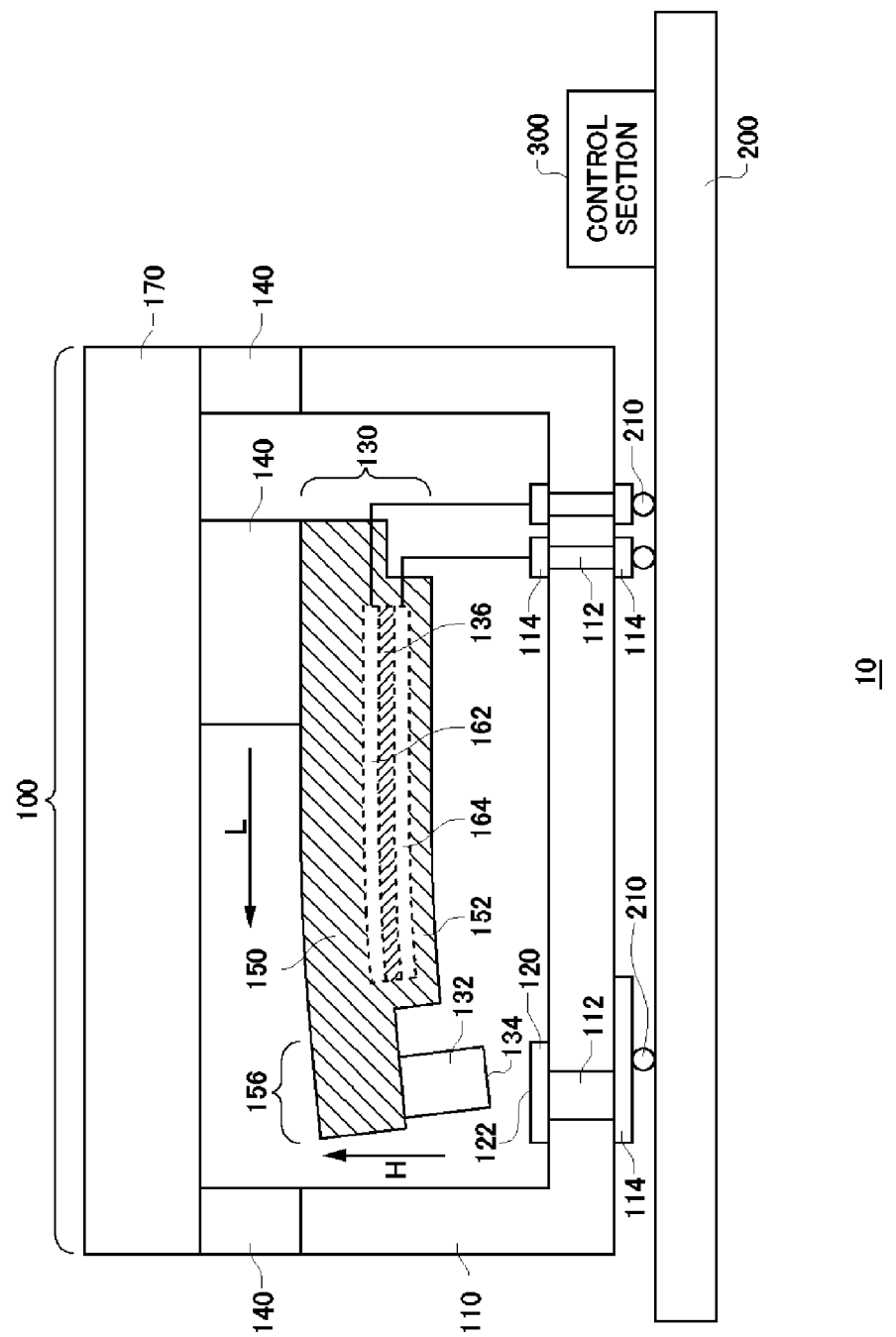
FIG. 1 is a side view of an actuator apparatus 10 according to the present embodiment.

FIG. 1 is a side view of an actuator apparatus 10 according to the present embodiment. The actuator apparatus 10 stably drives the actuator 100 by means of a predetermined control voltage. In this drawing, the actuator apparatus 10 according to the present example constitutes a switch apparatus for switching electric connection and disconnection depending on the control voltage. The actuator apparatus 10 includes an actuator 100, a mounting substrate 200, and a control section 300.

The actuator 100 switches electric conduction and non-conduction between a fixed contact and a movable contact by contacting and distancing a first contact section 122 and a second contact, where the first contact section 122 is a fixed contact provided at the base lower-part and the second contact 134 is a movable contact. The actuator 100 may be an apparatus formed by being sealed in a package or the like. The actuator 100 includes the base lower-part 110, the main body 130, the mount 140, and the base upper-part 170.

One surface of the base lower-part 110 is provided with the first contact section 120, and the other surface thereof is provided with a wire section 114 for exchanging an electric signal and a power supply or the like with outside devices. The base upper-part 110 may be an insulator such as a glass substrate, or may be a semiconductor substrate such as made of silicon. The base lower-part 110 includes a via 112.

The via 112 is formed by a metal covering a through hole penetrating the base lower-part 110. The via 112 electrically connects the electric wire formed on one surface thereof with the electric wire formed on the other surface. The via 112 in this example electrically connects the first contact section 120 with the wire section 114 formed on the other surface. In an example, the via 112 is filled with a conductive material or the like, so as to create an air-tight environment between the upper surface and the lower surface of the base lower-part 110. A plurality of vias 112 are provided on the base lower-part 110, in number corresponding to the number of first contact sections 122 provided at the base lower-part 110 or the number of electric signals or the power sources for the main body 130.

The wire section 114 conveys a signal to be passed through the actuator 100, an electric signal or a power voltage to be given to the main body 130. The wire section 114 may be a conductive wire pattern provided on one surface or the other surface of the base lower-part 110, for causing at least one via 112 to receive or transmit a signal. Instead, the wire section 114 may be provided on one surface or the other surface of the base upper-part 170. The wire section 114 includes a land, a connector, and/or an antenna or the like, and transmits and receives a signal to be passed onto the actuator 100 from outside.

The first contact section 120 is provided with a first contact 122. In an example, there may be a plurality of first contacts 120. One example of the first contact 122 is a plane pad without any protrusion. The first contact section 120 may include, aluminum, tungsten, palladium, rhodium, gold, white gold, ruthenium, indium, iridium, osmium, molybdenum, and/or nickel, for example. Here, the first contact section 120 may be an alloy of two materials including these materials.

The main body 130 includes a second contact 134, and makes contact to or distances itself from the first contact 122 by moving the second contact 134. The main body 130 is deposited using a semiconductor manufacturing apparatus or the like that adopts a sol-gel method or a CVD (Chemical Vapor Deposition) method. The main body 130 includes a second contact section 132, a piezoelectric film 136, a supporting layer 150, a protection film 152, a protrusion 156, and an electrode layer 162 and an electrode layer 164 of the piezoelectric film 136.

The second contact section 132 is provided with a second contact 134. The exemplary second contact section 132 contains a metal similar to the metal contained in the first contact section 120. The second contact 134 may be a plane without any protrusion, to enable surface contact with the first contact 122. However, the second contact 134 may have protrusion(s).

The second contact 134 may have a hemispherical shape so as to prevent any breakage or deterioration of the first contact 122. Alternatively, the second contact 134 may have a needle-like shape whose tip is rounded. In an example, the second contact 134 may have such a shape so as to enable formation of a transmission line with the first contact 122 whose width is in accordance with the frequency of a signal transmitted therethrough.

The piezoelectric film 136 is formed on the supporting layer 150, and expands and contracts in accordance with the driving voltage applied between the electrode layer 162 and the electrode layer 164. Upon reception of a driving voltage, the first piezoelectric film 136 may expand or contract in the lengthwise direction of the main body 130, and bends the main body 130 in the direction in which the distance between the first contact 122 and the second contact 134 changes.

For example, the piezoelectric film 136 may be a crystal of a wurtzite type such as lead zirconate titanate (PZT), lead lanthanum zirconate titanate (PLZT), aluminum nitride (AlN), zinc oxide (ZnO), or a perovskite type ferroelectric such as barium titanate (BTO). The film thickness of the piezoelectric film 136 may be in the range of 0.1 μm-5 μm, for example. Here, when depositing PZT as the piezoelectric film 136, it is preferable to first deposit the lead titanate (PT), and then the PZT. This arrangement helps deposit PZT with favorable crystallinity.

The supporting layer 150 is provided on one surface of the piezoelectric film 136. The supporting layer 150 has such elasticity that is deformed by force, and is bent subjected to force when the piezoelectric film 136 is contracted and expanded. The supporting layer 150 also has enough rigidity to prevent too much bending of the main body 130. When the field supply of the piezoelectric film 136 has stopped, the main body 130 returns to its default position.

When forming a piezoelectric film 136, the supporting layer 150 is heated to a firing temperature together with the piezoelectric film. In other words, the piezoelectric film 136 is heated to the firing temperature of the piezoelectric film 136, to be formed on one surface of the supporting layer 150, and the supporting layer 150 is heated to the firing temperature together with the piezoelectric film 136. With this in view, the supporting layer 150 is formed by a material that would not break down even when heated to the firing temperature of the piezoelectric film 136. When forming the piezoelectric film 136 by PZT or the like, the firing temperature may reach about 700 degrees centigrade or more. Therefore, it is desirable to make the supporting layer 150 by a material that would not cause physically breakage such as cracking, chipping, or chapping, even when heated up to the firing temperature of the piezoelectric film 136.

In addition, it is desirable that the supporting layer 150 is made of a material that is hard to cause chemical reaction with the piezoelectric film or with the electrode layer even when heated to the firing temperature of the piezoelectric film 136. It is also desirable to make the supporting layer 150 by a material that would not cause physically breakage such as cracking, chipping, or chapping, even when heated up to the firing temperature of the piezoelectric film, or that would not generate a compound with the piezoelectric film or with the electrode layer. It is further desirable to make the supporting layer 150 by a material that would not deteriorate the film characteristics (e.g., piezoelectric constant) of the piezoelectric film 136, even when heated at the firing temperature of the piezoelectric film.

In an example, the supporting layer 150 is made of an insulator material. For example, the supporting layer 150 made by an insulator layer can endure the firing temperature of the piezoelectric film (e.g., about 700 degrees centigrade) and such a supporting layer 150 can be formed in a short period of time using a cheaper production method than in the case of a metal film (e.g., CVD).

An exemplary supporting layer 150 includes silicon oxide ($SiO_2$) or silicon nitride (SiN). Alternatively, a supporting layer 150 may be made of a conductor such as aluminum, gold, and white gold, an insulator such as glass, or a semiconductor such as silicon. Here, the film thickness of the supporting layer 150 may be in the range of 0.1 μm-50 μm, for example.

The protection film 152 is made by an insulator material, and covers at least a part of the piezoelectric film 136 from the side opposite to the supporting layer 150, and makes contact with the supporting layer 150 at least at a part of the edge of the piezoelectric film 136. The protection film 152 and the supporting layer 150 are formed to cover each layer so as not to expose the piezoelectric film 136, the electrode layer 162, and the electrode layer 164, for example. Alternatively, the protection film 152 and the supporting layer 150 may be formed to expose the connection at which the electrode layer 162 and the electrode layer 164 are connected to respective wire sections 114.

The protection film 152 and the supporting layer 150 may be formed to cover a part of the piezoelectric film 136, the electrode layer 162, and the electrode layer 164. For example, the protection film 152 and the supporting layer 150 may cover the side of each of these layers. In other words, the protection film 152 and the supporting layer 150 may cover the side of the main body 130.

The protection film 152 may be formed by silicon oxide or silicon nitride (SiN). The protection film 152 may be formed by an insulator material that is the same type as that makes the supporting layer 150. Preferably, the protection film 152 may be made by substantially the same insulator material that makes the supporting layer 150. In other words, the protection film 152 has elasticity and rigidity just as the supporting layer 150, and is formed in strong attachment to the supporting layer 150 in close contact. Since the protection film 152 is formed by the same insulator material as that makes the supporting layer 150 in the present example, the drawing shows no boundary between the protection film 152 and the supporting layer 150.

The protection film 152 and the supporting layer 150 having substantially the same elasticity and rigidity embrace the piezoelectric film 136 the electrode layer 162, and the electrode layer 164, and therefore can prevent physical breakage of each layer such as cracking, chipping, or chapping, during such processes as producing the main body 130 or bending the main body 130. In addition, the rigidity of the protection film 152 helps enhance the rigidity of the main body 130.

In addition, since the protection film 152 is made of substantially the same material as that of the supporting layer 150, the protection film 152 can have substantially the same rigidity and elasticity as the supporting layer 150. Therefore, even when the main body 130 is displaced, the protection film 152 can restrain stress attributed to the inconsistency in rigidity and elasticity inside the main body 130.

Such a main body 130 can help prevent adhesion between contacts. Moreover, because the piezoelectric film 136, the electrode layer 162, and the electrode layer 164 are prevented from exposure to outside, the protection film 152 and the supporting layer 150 can prevent oxidation or the like of these layers.

The electrode layer 162 is provided on one surface of the piezoelectric film 136, and the electrode layer 164 is provided on the other surface of the piezoelectric film 136. The electrode layer 162 and the electrode layer 164 may be formed by substantially the same material and to substantially the same shape as each other, in an example, to apply a driving voltage to the piezoelectric film 136. In an example, the driving voltage has a predetermined negative or positive value.

In an example, the electrode layer 162 and the electrode layer 164 have a plane shape elongating in the lengthwise direction L of the main body 130. The electrode layer 162 and the electrode layer 164 may be a metal which has a low resistance and is easy to be processed, and some examples of the metal are aluminum, gold, white gold, copper, indium, tungsten, molybdenum, ruthenium, iridium, or the like. But alternatively, the electrode layer 162 and the electrode layer 164 may be an oxide electrode such as ruthenium oxide ($RuO_2$) and iridium oxide ($IrO_2$), a ceramic electrode, or a semiconductor such as silicon.

In an example, the electrode layer 162 and the electrode layer 164 may be white gold having a thickness of 0.2 82 m in the thickness direction H. In this way, when making an electrode by depositing white gold, it is preferable to deposit white gold after depositing titanium, tantalum, and chrome. When using silicon as a material of an electrode, it is desirable to use silicon doped with a high concentration of impurities.

The protrusion 156 is a part of the supporting layer 150 on which no piezoelectric film 136 is provided, on the movable tip of the main body 130. The second contact section 132 is provided on a surface of the protrusion 156, which faces the first contact section 120. By doing so, the second contact 134 is formed to be away from the electrode layer 162 and from the electrode layer 164, which helps lower the effect of the electric signal supplied to each electrode layer.

The mount 140 is provided on the base lower-part 110, and a part of which fixes an end of the main body 130 to be a fixing end of the main body 130. By coupling the mount 140 to the base lower-part 110, the distance between the first contact 122 and the second contact 134 will be equal to or lower than the maximum displacement amount of the main body 130. Here, in an example, the base lower-part 110 is provided with a concave portion for accommodating therein the main body 130, and the depth of the concave portion is used to adjust the distance between the first contact 122 and the second contact 134.

Here, the maximum displacement amount of the main body 130 corresponds to the displacement amount of the main body 130 that results when the maximum driving voltage ever applicable to the piezoelectric film 136 is applied. An exemplary mount 140 is formed by etching a semiconductor material. For example, the mount 140 may be formed from a silicon substrate. In this case, the mount 140 may be anodically bonded to the base lower-part 110.

In this way, the main body 130 is supported by the mount 140 at one end thereof in the lengthwise direction L. When the voltage to the piezoelectric film 136 is applied, the end of the main body 130 towards the second contact 132 not supported by the mount 140 will be bent in the thickness direction (i.e. displaced downward in the drawing), or is bent back (i.e. displaced upward in the drawing).

The base upper-part 170 is provided on the mount 140, and functions as a lid of the package of the actuator 100 constituted by the base lower-part 110 and the mount 140. Here, the package is formed as a sealed package for accommodating therein the main body 130, for example. For example, the base upper-part 170 is a substrate formed by a glass or the like. In this case, the base upper-part 170 is anodically bonded to the mount 140. Instead, the base upper-part 170 may be formed by a semiconductor material, or the like.

In the present embodiment example, the mount 140 is explained to fix the main body 130 to the base upper-part 170. However, it is also possible to form the mount 140 between the base lower-part 110 and the main body 130, to fix the main body 130 to the base lower-part 110. In the latter case, the thickness of the mount 140 should be formed to be equal to or lower than the maximum displacement amount of the main body 130.

An actuator 100 is mounted to the mounting substrate 200. The mounting substrate 200 is provided with an electric wire for conveying a signal to the actuator 100, an electric signal and a power-source voltage to the main body 130. Such an electric wire can be formed on one surface of the mounting substrate 200 having mounted thereon the actuator 100 or on the other surface. The electric wire can alternatively be formed on both surfaces. In addition, the mounting substrate 200 can have a multilayer structure, and includes the electric wires inside the substrate.

The mounting substrate 200 may be formed by an insulator material such as an epoxy resin, a glass epoxy material, Teflon (registered trademark) material, or a ceramic material. An exemplary mounting substrate 200 is electrically connected to the actuator 100 via the connecting section 210. In the drawing, the connecting section 210 may be a solder formed by a reflow process or the like.

In this case, an electrode such as BGA (ball grid array) or LGA (land grid array) is formed on the surface of the actuator 100 nearer the mounting substrate 200. Instead, the mounting substrate 200 may be electrically connected to the actuator 100 through wire bonding, a lead wire, a connector, or the like.

The mounting substrate 200 includes thereon a control section 300. In an example, the control section 300 is connected to the electric wire formed on the mounting substrate 200, and controls the actuator 100 by supplying thereto a control voltage. In an example, for setting the actuator 100 ON by bringing the first contact 122 into contact with the second contact 134, the control section 300 supplies a driving voltage to the piezoelectric film 136 to contract the piezoelectric film. In addition, for distancing the first contact 122 from the second contact 134 to set the actuator 100 OFF, the control section 300 stops supply of a driving voltage to the piezoelectric film 136. The control section 300 is detailed later.

Figure 2:
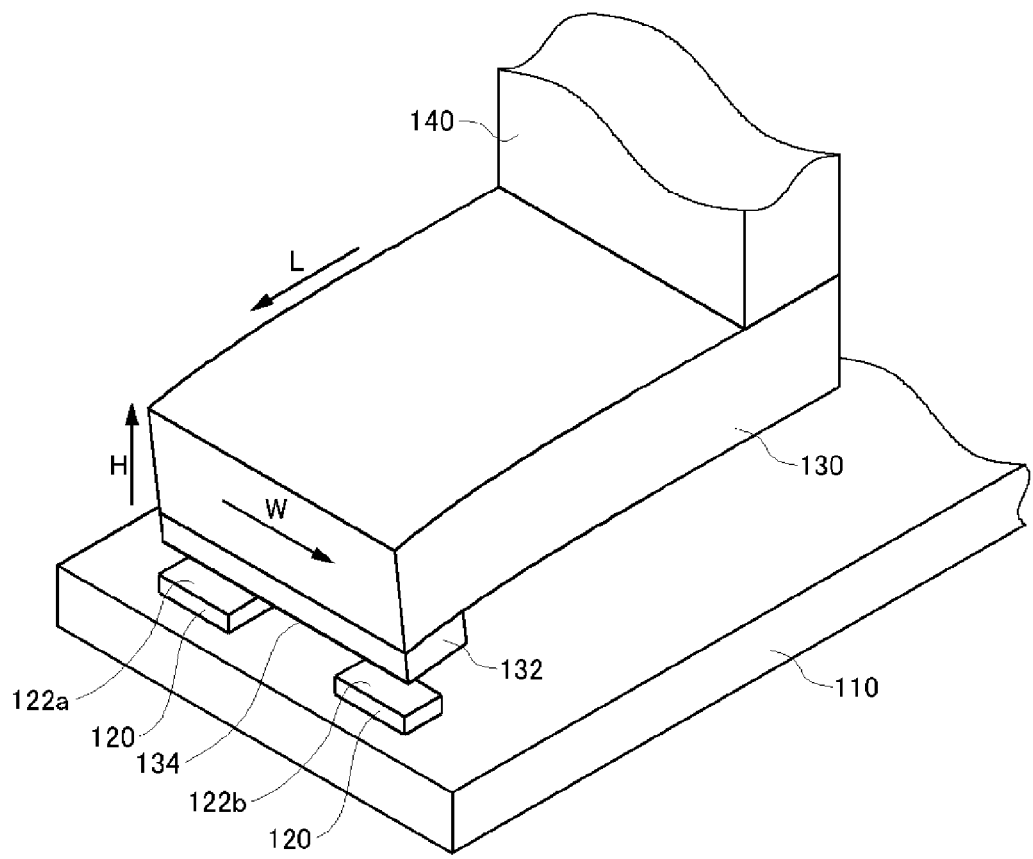
FIG. 2 shows an exemplary internal configuration of an actuator 100 according to the present embodiment.

FIG. 2 shows an exemplary internal configuration of an actuator 100 according to the present embodiment. In this drawing, the operation similar to the operation of the actuator 100 in the embodiment of FIG. 1 is assigned the same reference numeral, and its explanation is omitted in the following. The actuator 100 in FIG. 2 is created such that two first contact sections 120 are provided on the base lower-part 110, to bring into contact and separate the two first contacts 122 and the second contact 134. Accordingly, the actuator 100 can switch electrical conduction and non-conduction between the first contact 122a and the first contact 122b via the second contact 134.

Here, the wire section 114 is formed on the other surface of the base lower-part 110 which is opposite to the surface on which the first contact section 120 is provided, to connect the two first contact sections 120 each other using the via 112. Instead, the wire section 114 may also be formed on both of the surfaces of the base lower-part 110, and the wire section 114 formed on one surface is connected to the two first contact sections 120, and to the wire section 114 formed on the other surface using the via 112.

The wire section 114 includes a corresponding ground wire, and constitute a coplanar line. In addition, the wire section 114 may include a corresponding ground wire, and constitute a microstrip line. The wire section 114 may convey an electric signal from outside to the first contact 122a, and an electric from the first contact 122b to outside, when the actuator 100 is ON.

Instead, the actuator 100 may include a single first contact section 120 on the base lower-part 110, and a wire for transmitting an electric signal from outside to the main body 130, to the second contact 134. In this case, the wire is connected to the wire section 114 formed on one surface of the substrate lower-part 110 provided in a position different from the first contact section 120, and exchanges an electric signal with external devices. In an example, the wire passes an electric signal from outside to the first contact 122, when the actuator 100 is set ON, and conveys the electric signal to outside via the wire section 114 connected to the first contact section 120.

In the embodiment example, the main body 130 was explained as a unimorph type which includes a single piezoelectric film. The main body 130 may alternatively be a bimorph type which includes two piezoelectric films. In the latter case, the two piezoelectric films are provided on the two surfaces of the supporting layer 150 of the main body 130, and the corresponding electrodes supplying a field to the piezoelectric films are provided. An alternative configuration is also possible in which the main body 130 does not include any supporting layer 150, and the two piezoelectric films are provided on the two surfaces of a common electrode, and the corresponding electrodes supplying a field to the piezoelectric films are provided.

In the present embodiment example, the second contact section 132 is explained to be provided for the protrusion 156. However, the second contact section 132 may alternatively be provided on the movable end side of the protection film 152 opposing the base lower-part 110. In this case, the main body 130 does not have to include any protrusion 156 therein.

In the present embodiment example, the actuator 100 was explained to be a switch for moving the second contact by means of contraction and expansion of the piezoelectric film, to contact the second contact to the first contact or to distance the second contact from the first contact. The actuator 100 may alternatively include therein a driving section. Also, alternative to the piezoelectric actuator, the actuator may be an electrostatic actuator for driving the parallel plane electrode according to electrostatic attractive force by giving thereto a field.

It should be noted here that the main body 130 may be bent back due to the internal stress caused during the manufacturing process. The internal stress may be in various magnitudes and directions inside the main body 130, depending on the manufacturing method of the main body 130, the layer structure of the main body 130, and the material of it. In other words, the direction of the bending of the main body 130 is caused by generation of various internal stresses, and so how much and exactly in what direction the end portion nearer the second contact section 132 is bent in the thickness direction H of the main body 130 can be different at each time of production.

In this way, it is difficult to produce the main body 130 with a constant default displacement amount. Therefore, if the same driving voltage is used to drive a main body 130, the moving distance will depend on its default displacement amount. In other words, the actuator 100 may cause a) a case in which the first contact 122 cannot be electrically connected to the second contact 134, or b) a case in which the first contact 122 is pressed too hard onto the second contact 134 to cause damage or harm to the electrode.

Therefore, the conventional actuator 100 requires a complex control method to change the driving voltage according to each default displacement amount. In such a complex control method, however, when for example the default displacement amount occurs in the direction in which the contacts are distanced from each other, the movable range of the main body 130 is increased by increasing the driving voltage. However, the increase in driving voltage also generates acceleration, which increases the impact of collision between the contacts, to cause damage or harm. So as to solve this problem, the present embodiment provides the actuator apparatus 10 with a setting section to set the operating speed and the driving voltage of the actuator 100, to control the actuator 100.

Figure 3:
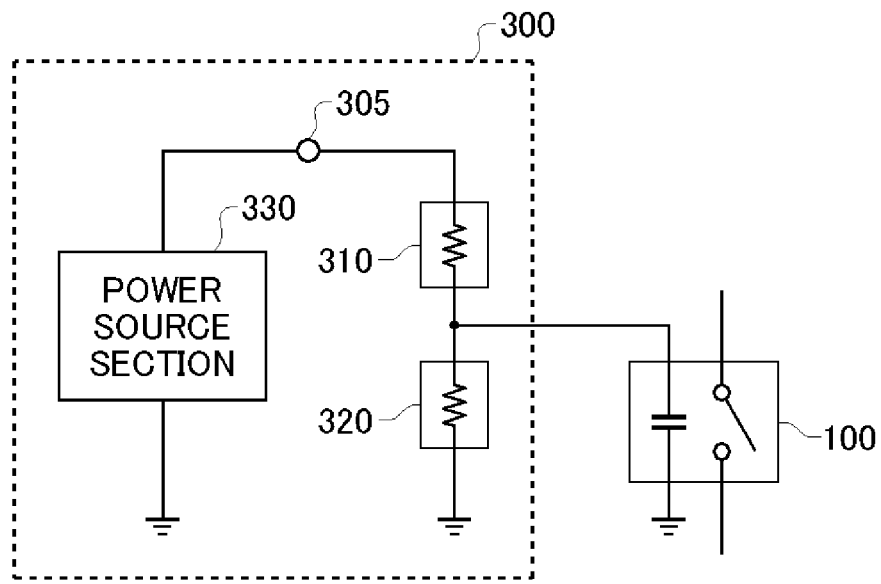
FIG. 3 shows an exemplary configuration of a control section 300 according to the present embodiment, together with the actuator 100.

FIG. 3 shows an exemplary configuration of a control section 300 according to the present embodiment, together with the actuator 100. The actuator 100 is driven by receiving a driving voltage at one end and a reference potential at the other end. The drawing shows the reference potential of 0V. Here, in the actuator 100, the electrode portion to which the driving voltage is applied is considered as an equivalence circuit and hence the capacitance component. Therefore, the electrode portion is shown as the capacitance component. The control section 300 includes a first setting section 310, a second setting section 320, and a power source section 330.

The first setting section 310 is connected to an end of the actuator 100, to set the operating speed of the actuator. In this embodiment example, the other end of the first setting section 310 is connected to the power source section 330. Here, when viewed from the power source section 330 which applies a control voltage, the input terminal 305 receives a control voltage from outside, and the first setting section 310 is connected between the input terminal 305 and one end of the actuator 100.

Furthermore, in an example, the first setting section 310 includes a first resistance element connected between the input terminal 305 and an end of the actuator 100. The first resistance element forms a differential circuit together with the capacitance component of the actuator 100, and relaxes the temporal rise of the control voltage inputted from the input terminal 305. In other words, the first resistance element adjusts the resistance value, to supply, to the actuator 100, the driving voltage in which the temporal rise is relaxed by means of the resistance value, and can set the operating speed of the actuator 100.

Here, the resistance value of the first resistance element is determined according to the operating speed of the actuator 100. Alternatively, the resistance value of the first resistance element may be determined according to the default displacement amount of the actuator 100. For example, the driving voltage to be applied is determined according to the default displacement amount of the actuator 100, the resistance value of the first resistance element is determined such that the differential circuit which can provide an relaxation time according to the driving voltage.

An exemplary first setting section 310 may include a plurality of resistance elements, and one of the resistance elements selected according to the operating speed of the actuator 100 can be set as the first resistance element. Accordingly, an exemplary first setting section 310 may include a predetermined plurality of resistance elements and circuit wire, to disconnect the rest of the circuit wires excluding the connection of the resistance element selected according to the operating speed of the actuator 100, to determine the first resistance element.

Instead, the first setting section 310 may include a resistance element in a predetermined shape, to enable adjustment of the resistance value of the resistance element by trimming. For example, the resistance value of the resistance element can be adjusted by laser trimming that conducts trimming by irradiation of laser light. Instead, the resistance value of the resistance element may be adjusted by the anodization trimming for adjusting the film pressure of the oxide film by anode oxidation in the electrolyte. Alternatively, the first setting section 310 may include a predetermined plurality of resistance elements in advance, so that the resistance element selected according to the operating speed of the actuator 100 can be further adjusted by the trimming.

The second setting section 320 is provided between one end of the actuator 100 and the reference potential, and sets the driving voltage of the actuator 100. In the present embodiment example, the second setting section 320 is connected to an end of the first setting section 310. In the present embodiment example, the second setting section 320 includes a second resistance element connected between one end of the actuator 100 and the reference potential. Accordingly, the first resistance element and the second resistance element divide the control voltage applied to the input terminal 305, and supplies half of the voltage allocated for the second resistance element, to the actuator 100 as the driving voltage.

In other words, by adjusting the resistance value of the second resistance element, the driving voltage according to this resistance value can be supplied to the actuator 100. Also by this arrangement, the second setting section 320 can set the driving voltage that is in accordance with the default displacement amount of the actuator 100 and supply it to the actuator 100, even when the control voltage from the power source section 330 is constant.

Here, the second setting section 320 may include a plurality of resistance elements, and sets the resistance selected in accordance with the default displacement amount of the actuator 100 to be the second resistance element connected between one end of the actuator 100 and the reference potential. Accordingly, an exemplary second setting section 320 may include a predetermined plurality of resistance elements and circuit wire, to disconnect the rest of the circuit wires except for the connection of the resistance element selected according to the default displacement amount of the actuator 100, to determine the second resistance element.

Instead, the second setting section 320 may include a resistance element in a predetermined shape, to enable adjustment of the resistance value of the resistance element by trimming. Alternatively, the second setting section 320 may include a predetermined plurality of resistance elements in advance, so that the resistance element selected according to the operating speed of the actuator 100 can be further adjusted by the trimming. The resistance elements included in the first setting section 310 and/or the second setting section 320 in the above embodiment example may be a fixed resistance element having a predetermined resistance value, or a variable resistance whose resistance value is variable.

The power source section 330 supplies a voltage equal to or greater than the driving voltage of the actuator 100, as the control voltage. The first setting section 310 according to the present embodiment can set the driving voltage whose rise time is relaxed according to the operating speed of the actuator 100, and the second setting section 320 can set the driving voltage according to the default displacement amount of the actuator 100. Therefore, even when the actuator 100 has a variety of default displacement amount from the manufacturing process, the power source section 330 can supply a predetermined constant voltage.

In the present embodiment example, the control section 300 was explained to include a power source section 330. However alternatively, the control section 300 may be a circuit that receives a control voltage at the input terminal 305 from outside, without being equipped with the power source section 330. In such a case, the control section 300 can set the control voltage for switching ON/OFF of the actuator 100 to a predetermined voltage.

Figure 4:
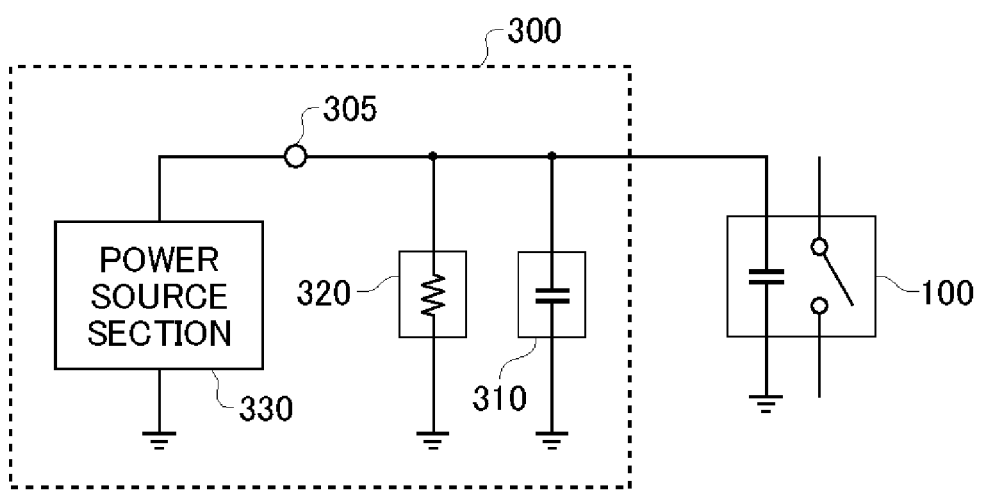
FIG. 4 shows a modification example of the control section 300 according to the present embodiment, together with the actuator 100.

FIG. 4 shows a modification example of the control section 300 according to the present embodiment, together with the actuator 100. In the control section 300 of this modification example, the operation of the control section 300 similar to the operation of the control section 300 according to the embodiment of FIG. 3 is assigned the same reference numeral, and its explanation is omitted in the following.

The first setting section 310 in this example is connected between an end of the actuator 100 and the reference potential. The first setting section 310 is also connected between the input terminal 305 and the reference potential. In an example, the first setting section 310 includes a capacitance element connected between an end of the actuator 100 and the reference potential.

In this modification example, since the control section 300 is connected to the actuator 100 in parallel, the temporal rise of the control voltage supplied from the input terminal 305 until the full charge of the capacitance element is relaxed. In other words, by adjusting the capacitance value of the capacitance element, the actuator 100 can be supplied with the driving voltage in which the temporal rise is relaxed according to the capacitance value, to set the operating speed of the actuator 100.

Here, the capacitance value of the capacitance element can be determined according to the operating speed of the actuator 100, just as in the case of the first resistance element. Instead, however, the capacitance value of the capacitance element can be determined according to the default displacement amount of the actuator 100.

Here, the first setting section 310 may include a plurality of capacitance elements, and connect one of the capacitance elements selected according to the operating speed of the actuator 100, between one end of the actuator 100 and the reference potential. Accordingly, the first setting section 310 may include a predetermined plurality of capacitance elements and circuit wire, to disconnect the rest of the circuit wires except for the connection of the capacitance element selected according to the operating speed of the actuator 100, to connect the selected capacitance element between an end of the actuator 100 and the reference potential.

The control section 300 in this modification example includes a resistance terminal in the second setting section 320. Here, when the second setting section 320 sets the driving voltage of the actuator 100, it may further include a resistance element between the input terminal 305 and the resistance element. In this case, the first setting section 310 is connected between two resistance elements. Accordingly, the second setting section 320 can divide the control voltage inputted from the input terminal 305, by two resistance elements, set the driving voltage according to the default displacement amount of the actuator 100, and supply it to the actuator 100.

The actuator apparatus 10 according to the present embodiment was explained such that the control section 300 including the first setting section 310 and the second setting section 320 is mounted to the mounting substrate 200. However alternatively, it is possible to provide the first setting section 310 and/or the second setting section 320 in the actuator 100. Since the first setting section 310 and the second setting section 320 can be constituted by such components as a resistance element or a capacitance element, they can be included in a package of the actuator 100.

Instead, the first setting section 310 and/or the second setting section 320 may be mounted outside the package of the actuator 100. In addition, when one of the first setting section 310 and the second setting section 320 is included in the package of the actuator 100, the other of them is mounted on the mounting substrate 200.

In the embodiment explained above, the driving voltage that the actuator apparatus 10 supplies to the actuator 100 varies for each default displacement amount. Instead, the actuator apparatus 10 may mount thereon the actuator 100 having a default displacement amount in a predetermined direction, and supply the driving voltage according to the default displacement amount to the actuator 100.

When the actuator 100 is formed such that the internal stress of the piezoelectric film is directed to a predetermined direction, the actuator 100 will be displaced in the predetermined direction by default due to the internal stress. For example, the actuator 100 can be formed by displacing the first contact 122 and the second contact 134 to approach each other by default.

In this case, when the power source section 330 is formed such that the default displacement amount of the actuator is zero, the power source section 330 can supply, as the control voltage, the voltage whose value is about the driving voltage electrically connecting the first contact to the second contact. In other words, if this arrangement is made, the power source section 330 does not have to consider the case in which the first contact 122 and the second contact 134 are displaced by default to be apart from each other, thereby enabling to drop the control voltage for setting the actuator 100 to be ON.

Figure 5:
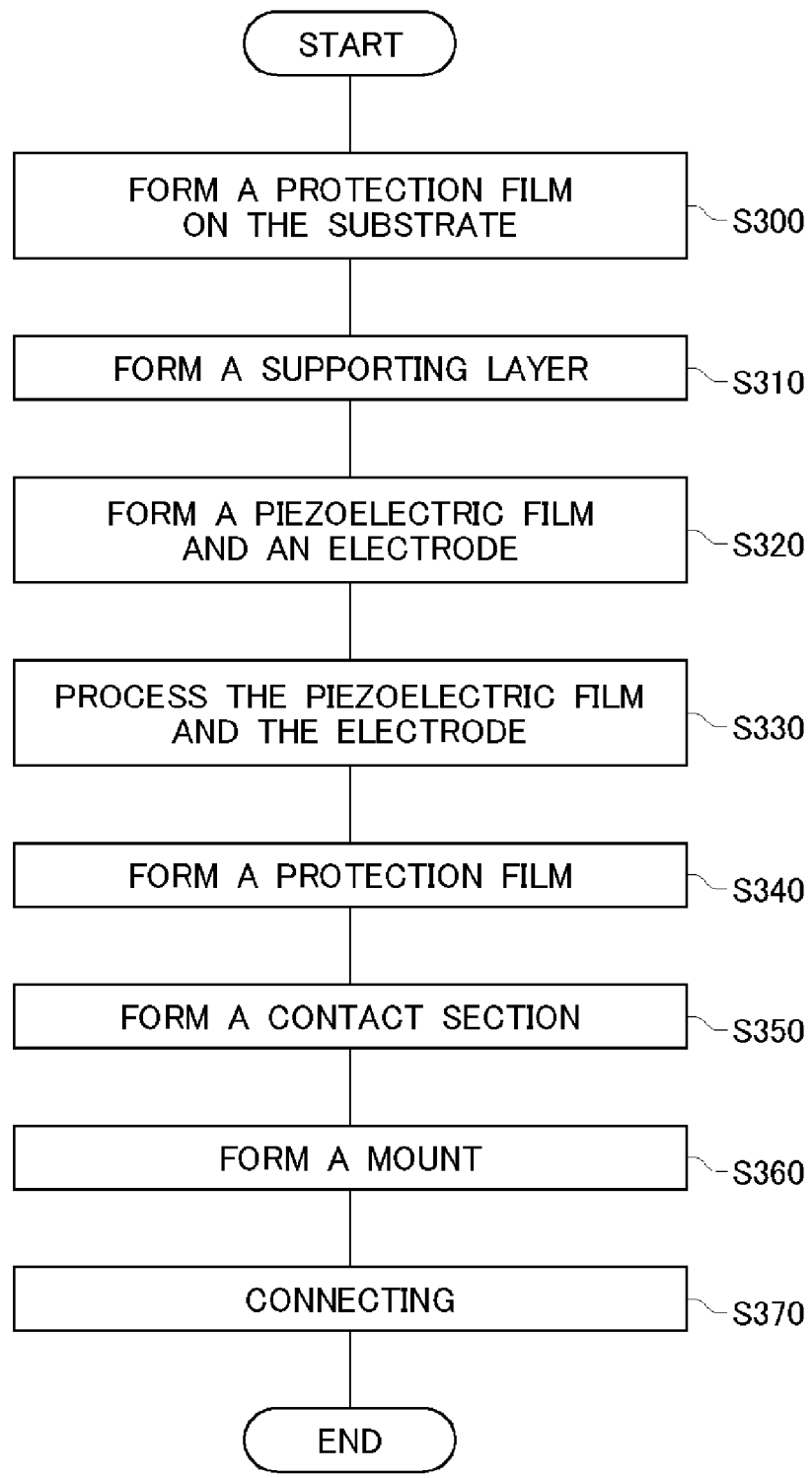
FIG. 5 shows an exemplary production flow by which the actuator 100 according to the present embodiment is produced.

FIG. 5 shows an exemplary production flow by which the actuator 100 according to the present embodiment is produced. FIG. 6 through FIG. 16 show either a cross sectional view or a top view of the actuator 100 during the production process of the actuator 100 according to the present embodiment.

Figure 6:
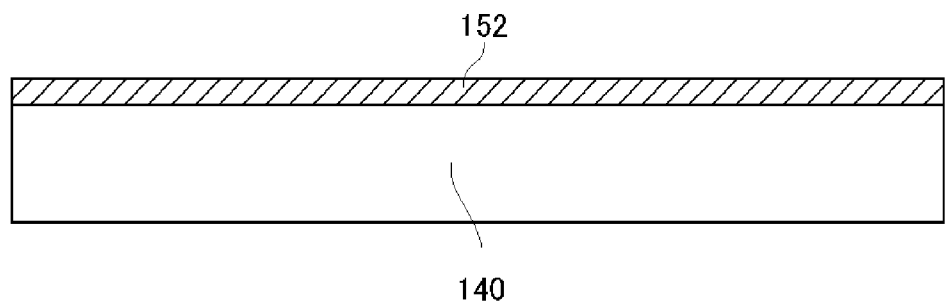
FIG. 6 shows a sectional view of a protection film 152 formed on a substrate which will function as a mount 140, according to the present embodiment.

First, a protection film 152, made of an insulator material, is formed on the substrate which will serve as the mount 140 (S300). In this embodiment example, the substrate is a silicon substrate, and the protection film 152 is silicon oxide. The protection film 152 is formed using a CVD method for example. An example of the protection film 152 made of silicon oxide can be formed by reacting the source material TEOS (Tetra Ethyl Ortho Silicate) with either oxygen or ozone. FIG. 6 shows a sectional view of a protection film 152 formed on a substrate which will function as a mount 140, according to the present embodiment.

Next, a supporting layer 150 is formed on the protection film 152 (S310). In this embodiment example, the supporting layer 150 is made of silicon oxide. In an example, the supporting layer 150 is formed by a CVD method used to form the protection film 152. Since the supporting layer 150 and the protection film 152 are made of the same material, the boundary therebetween is not shown in the drawing. When the supporting layer 150 and the protection film 152 are made of the same material and in the same method, Step S300 for forming the protection film 152 may be omitted.

Next, on the supporting layer 150, the electrode layer 162, the piezoelectric film 136, and the electrode layer 164 are formed (S320). The electrode layer 162 is formed by depositing a conductive material on the protection film 152. The piezoelectric film 136 is deposited on the electrode layer 162 by a sol-gel method by which a sol-gel material is applied on the electrode layer 162 and annealed. Here, an example of the sol-gel material includes a PZT sol-gel solution.

Figure 7:
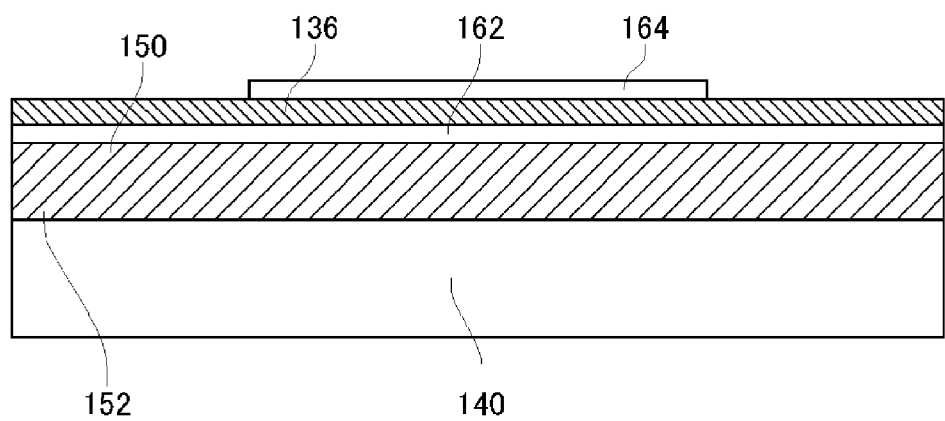
FIG. 7 shows a sectional view of a supporting layer 150, an electrode layer 162, a piezoelectric film 136, and an electrode layer 164, which are formed on the protection film 152 according to the present embodiment.

In the present embodiment example, the piezoelectric film 136 is a PZT film formed by applying a PZT sol-gel solution. The electrode layer 164 is formed by depositing a conductive material on the piezoelectric film 136. The conductive material from which the electrode layer 162 and the electrode layer 164 are made may include white gold (Pt) for example. The first electrode layer 162 and the second electrode layer 164 may be formed by evaporation or sputtering for example. FIG. 7 shows a sectional view of a supporting layer 150, an electrode layer 162, a piezoelectric film 136, and an electrode layer 164, which are formed on the protection film 152 according to the present embodiment. Here, the electrode layer 164 is formed in a predetermined shape on the piezoelectric film 136 in photolithography.

Next, the electrode layer 162, the piezoelectric film 136, and the electrode layer 164 are subjected to processing (S330). The shape of the surface of the electrode layer 162, the first piezoelectric film 136, and the electrode layer 164 is processed by etching. In an example, the supporting layer 150 is used as an etching stop layer. Here, when the electrode layer 164 has been formed in a predetermined form, the electrode layer 162 and the piezoelectric film 136 are processed to have substantially the same shape as the electrode layer 164.

Figure 8:
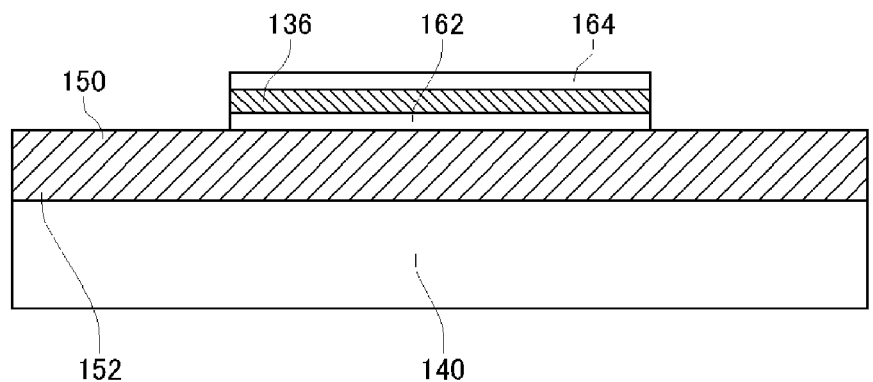
FIG. 8 shows a sectional view of an electrode layer 162, a piezoelectric film 136, and an electrode layer 164, which have been processed, according to the present embodiment.

FIG. 8 shows a sectional view of an electrode layer 162, a piezoelectric film 136, and an electrode layer 164, which have been processed, according to the present embodiment. In an example, the piezoelectric film 136 and the electrode layer 164 are formed to be exposed in the upper surface direction facing away from the substrate, as the connection section to be coupled with the wiring section 114 after the electrode layer 162.

Figure 9:
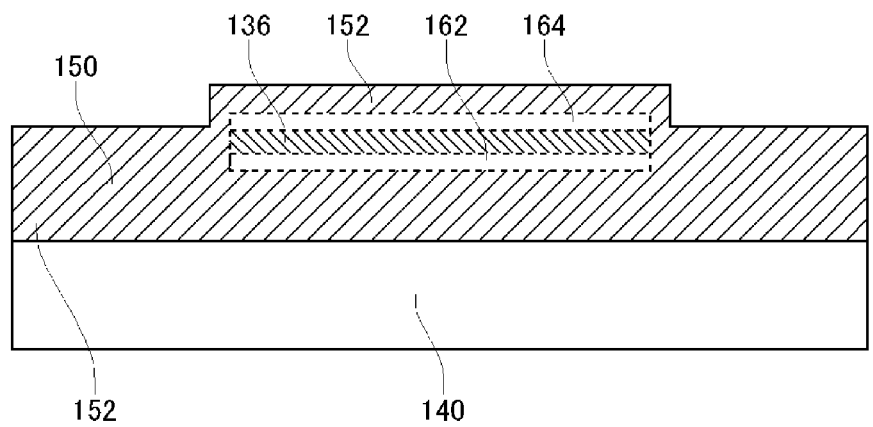
FIG. 9 shows a sectional view of a protection film 152 formed on an electrode 164 according to the present embodiment.

Next, the protection film 152 made of an insulator material is formed on the electrode layer 164 (S340). In this embodiment example, the protection film 152 is silicon oxide, and together with the supporting layer 150, covers the electrode layer 162, the piezoelectric film 136, and the electrode layer 164. In an example, the protection film 152 is formed by CVD used to form the supporting layer 150. Since the protection film 152 and the supporting layer 150 are formed by the same material, the electrode layer 162, the piezoelectric film 136, and the electrode layer 164 are formed within the silicon oxide layer formed from the protection film 152 and the supporting layer 150. FIG. 9 shows a sectional view of a protection film 152 formed on an electrode 164 according to the present embodiment.

Next, the supporting layer 150 and the protection film 152 are subjected to processing. Here, the supporting layer 150 and the protection film 152 are processed to the shape of the main body 130, while keeping to cover the piezoelectric film 136, the electrode layer 162, and the electrode layer 164.

The supporting layer 150 and the protection film 152 are formed on the movable end of the main body 130, except on the protrusion 156 on which no piezoelectric film 136 is formed. The supporting layer 150 and the protection film 152 may be formed by etching.

Figure 10:
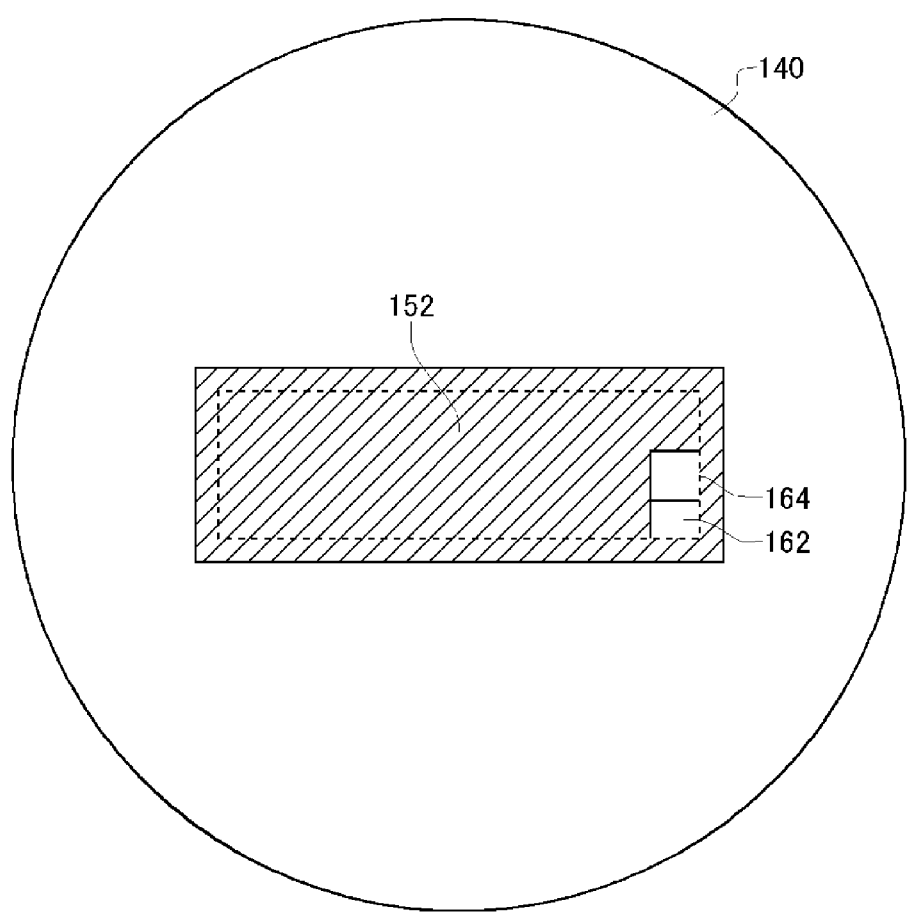
FIG. 10 is an upper view of a supporting layer 150 and a protection film 152, which have been processed, according to the present embodiment.

FIG. 10 is an upper view of a supporting layer 150 and a protection film 152, which have been processed, according to the present embodiment. In this drawing, a single main body 130 formed by a plurality of electrode layers and piezoelectric films is formed on the substrate. By then, the supporting layer 150 and the protection film 152 have been processed to a surface shape of the main body 130, and so the portion of the substrate that will serve as the mount 140 is exposed. In addition, the connection section between the electrode layer 162 and the electrode layer 164 is exposed from the above. Here, the diameter of the substrate used in the manufacturing may be 2 inches or larger. In this case, a plurality of main bodies 130 may be formed on the substrate.

Figure 11:
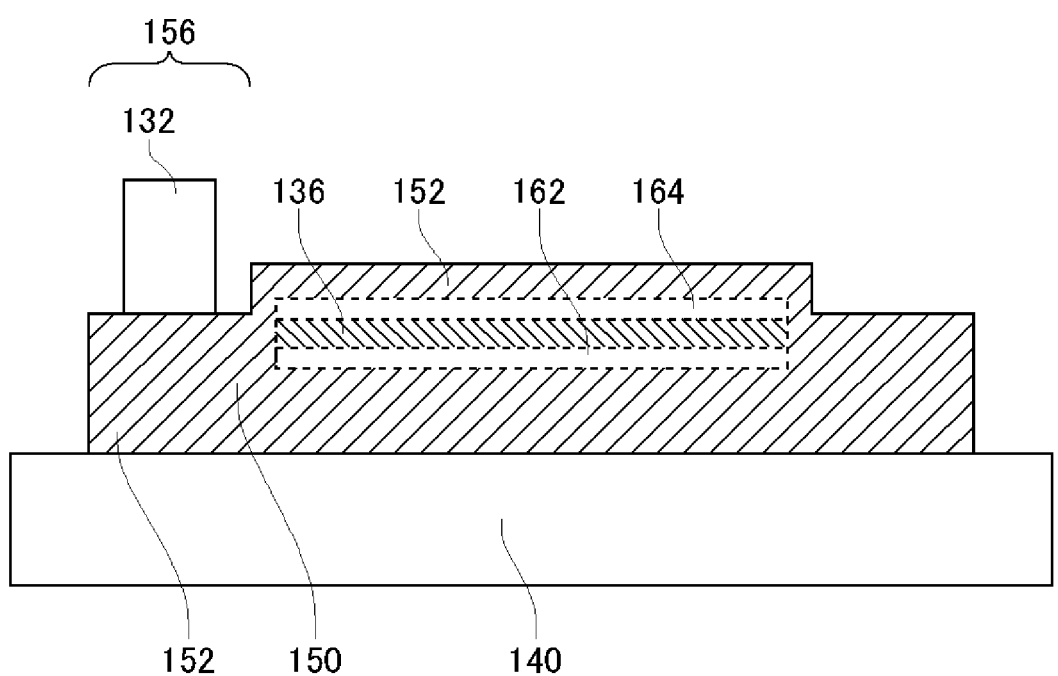
FIG. 11 is a sectional view of a second contact section 132 according to the present embodiment formed on a protrusion 156.

Next, the second contact section 132 is formed on the protrusion 156 (S350). FIG. 11 is a sectional view of a second contact 132 according to the present embodiment formed on a protrusion 156.

Next, the mount 140 is formed by processing the substrate (S360). Here, the mount 140 is formed by removing a part of the substrate, by etching the other surface of the substrate, which is opposite to the surface on which the main body 130 is formed. Here, in an example, the protection film 152 (or the supporting layer 150 when no protection film 152 is formed) is used as an etching stop layer when etching the mount 140.

Figure 12:
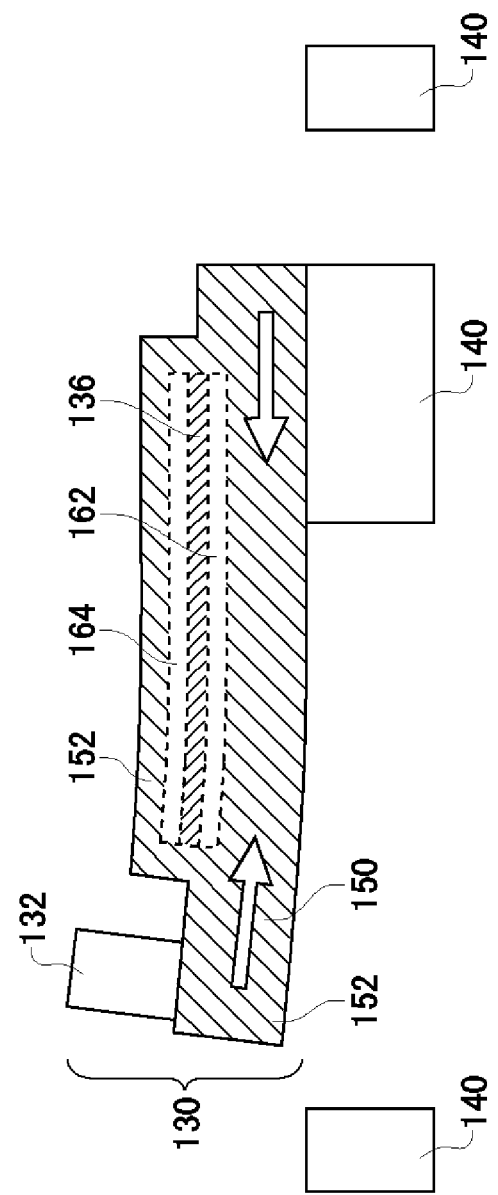
FIG. 12 is a sectional view of the mount 140 formed by processing the substrate according to the present embodiment.

In this process, an end of the main body 130 is separated from the substrate to serve as a movable end, and the other end fixed to the mount 140 stands alone as a fixed end. FIG. 12 is a sectional view of the mount 140 formed by processing the substrate according to the present embodiment. Here, the main body 130 will be displaced by means of the internal stress. In this drawing, the movable end of the main body 130 is displaced in a direction distanced from the mount 140 due to the internal stress occurring in the direction of the arrow.

Here, in the process of forming the actuator 100 according to the present embodiment example, the supporting layer 150, the protection film 152, the piezoelectric film 136, the electrode layer 162, and/or the electrode layer 164 are formed so that the internal stress is oriented in the predetermined direction, and the internal stress can be used to displace the main body 130 into the predetermined direction by default. In other words, the main body 130 is formed so that the internal stress occurs in the direction shown by the arrow, so as to displace the main body 130 in a direction to be distanced from the mount 140 by means of the internal stress. Accordingly, the control section 300 can lower the control voltage to switch ON the actuator 100.

Figure 13:
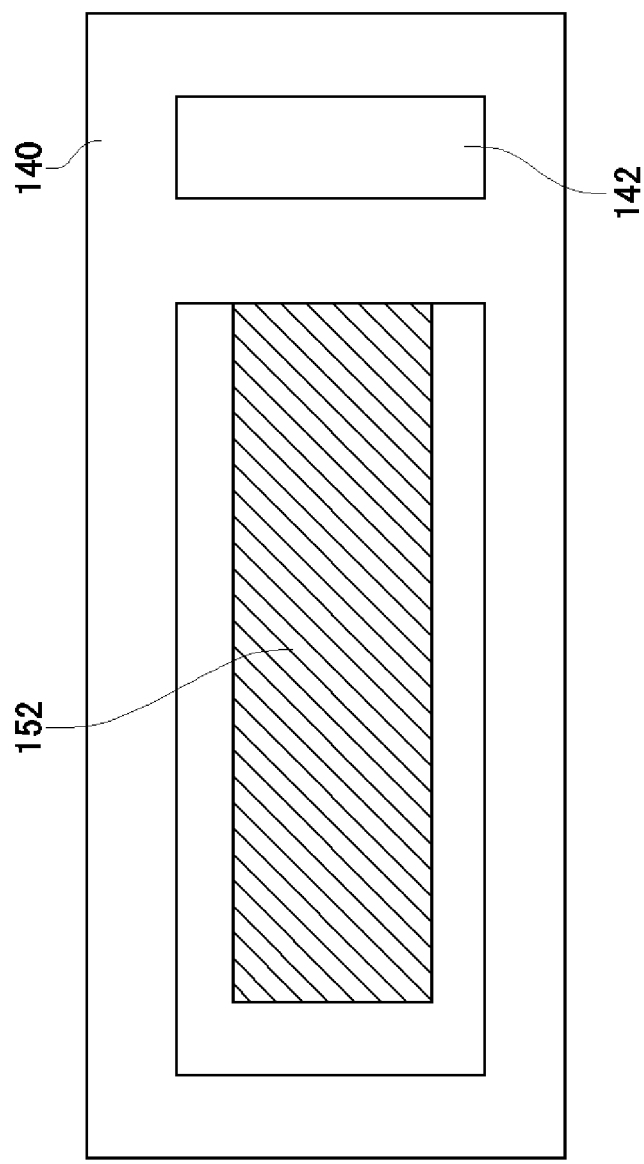
FIG. 13 is a lower view of the mount 140 formed by processing the substrate according to the present embodiment.

FIG. 13 is a lower view of the mount 140 formed by processing the substrate according to the present embodiment. FIG. 13 shows the main body 130 viewed from the side of the mount 140. The protection film 152 is exposed on the mount 140 side of the main body 130. Here, an opening 142 is provided through the mount 140. The opening 142 is used to connect the electric wire for exchanging electric signals with the main body 130.

Next, the mount 140 is connected to each of the base lower-part 110 and the base upper-part 170 (S370). The base lower-part 110 and the base upper-part 170 in the present example may be formed by a glass substrate, and respectively anodically bonded to the mount 140, where the anodic bonding applies a voltage and gives a heat.

Figure 14:
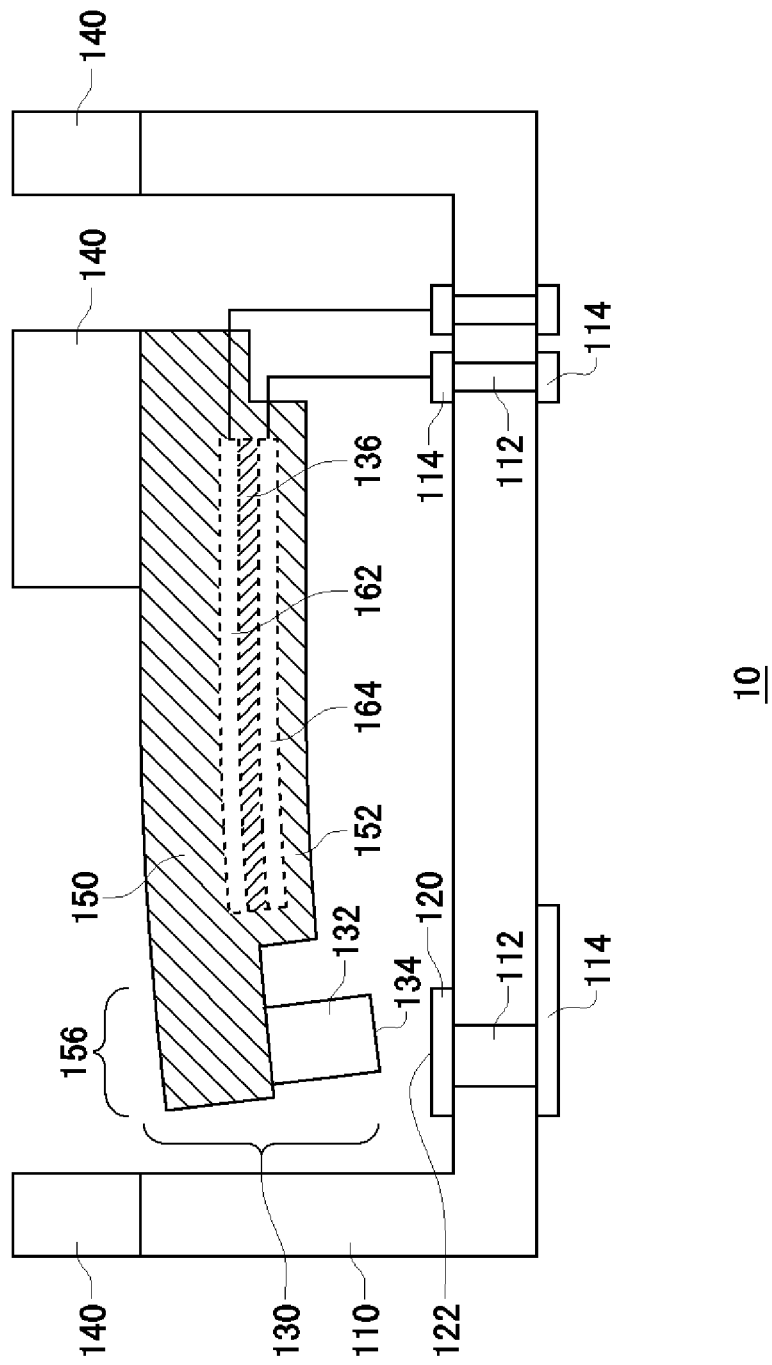
FIG. 14 is a sectional view of the mount 140 according to the present embodiment connected to the base lower-part 110.

FIG. 14 is a sectional view of the mount 140 according to the present embodiment connected to the base lower-part 110. The connections between the electrode layer 162 and the electrode layer 164 are respectively connected to the wires 114 provided on the base lower-part 110. For example, the connections and the wires 114 are pressure bonded to each other. The connection is performed through the opening 142 of the mount 140, for example.

Figure 15:
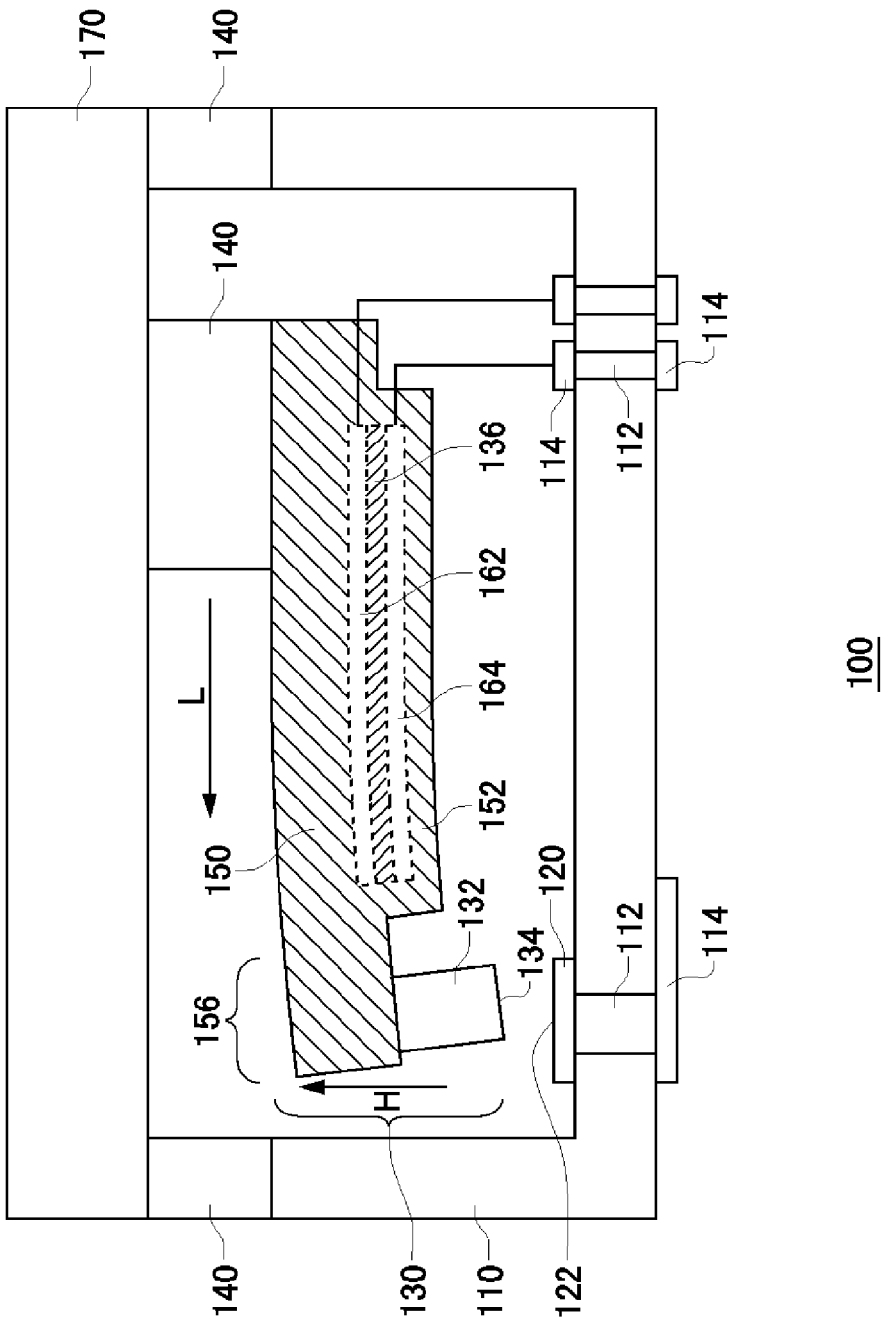
FIG. 15 is a sectional view of the mount 140 according to the present embodiment connected to the base upper-part 170.

FIG. 15 is a sectional view of the mount 140 according to the present embodiment connected to the base upper-part 170. The main body 130 of the actuator 100 thus formed is driven according to the control signal given from the control section 300 provided outside the base, to enable contacting/distancing between the first contact 122 and the second contact 134.

As stated above, the actuator 100 according to the present embodiment is formed by embracing the piezoelectric film 136, the electrode layer 162, and the electrode layer 164, in the protection film 152 having substantially the same elasticity and rigidity as the supporting layer 150. Instead, without forming the protection film 152, the piezoelectric film 136, the electrode layer 162 and the electrode layer 164 may be formed on the supporting layer 150 of the actuator 100. The actuator 100 according to the stated embodiment has a main body 130 having a single piezoelectric film 136. However alternatively, the main body 130 may include two or more piezoelectric films stacked each other. In this case, the main body 130 is created as a multilayer by piezoelectric films and electrodes.

Figure 16:
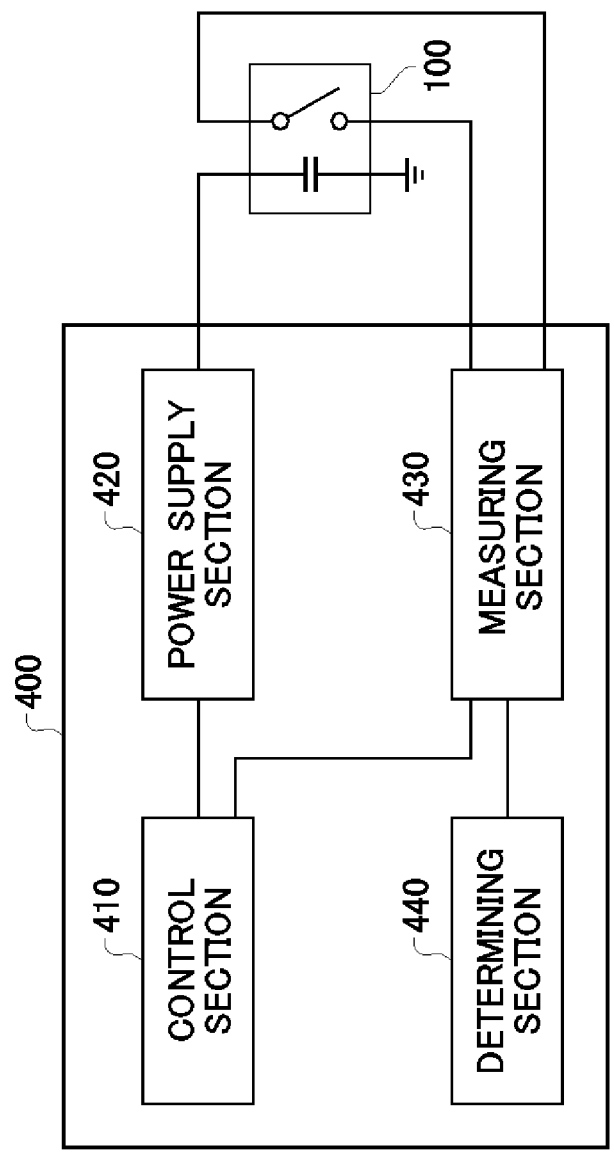
FIG. 16 is a configuration example of the test apparatus 400 according to the present embodiment, together with the actuator 100.

FIG. 16 is a configuration example of the test apparatus 400 according to the present embodiment, together with the actuator 100. The test apparatus 400 tests the operation of the actuator 100. The test apparatus 400 supplies a driving voltage to the actuator 100, and tests the switching characteristics of the actuator 100. The test apparatus 400 also determines the circuitry elements and/or the circuitry connection between the first setting section 310 and the second setting section 320 connected to the actuator 100. The test apparatus 400 includes a control section 410, a power source supply section 420, a measuring section 430, and a determining section 440.

The control section 410 tests the actuator 100 according to the execution of a test program and/or a user input. The control section 410 outputs the driving voltage to the power source supply section 420, and controls the measuring section 430 to measure the electric connection between the contacts of the actuator 100, according to a test to be executed.

The power supply section 420 is connected to the control section 410, and supplies the driving voltage to the actuator 100 according to the instruction given from the control section 410. For example, the power source supply section 420 supplies the driving voltage that is incremented gradually from 0V. Instead, the driving voltage supplied from the power source supply section 420 may be in a predetermined pulse type.

The measuring section 430 is connected to the control section 410, and measures the correspondence between the driving voltage of the actuator 100 and the electric connection between the first contact and the second contact, in accordance with the instruction given from the control section 410. That is, the measuring section 430 measures conduction/non-conduction of the actuator 100. In addition, the measuring section 430 measures the operating speed of the actuator 100.

The determining section 440 determines the circuit of the second setting section 320, according to the correspondence measured by the measuring section 430. In an example, the determining section 440 determines the driving voltage to set the actuator to be ON, according to the measurement result concerning conduction/non-conduction of the actuator 100 measured by the measuring section 430, with respect to the driving voltage gradually incremented from 0V supplied by the power source supply section 420. Next, the determining section 440 determines the circuit of the second setting section 320 based on the driving voltage to set the actuator 100 to be ON. Specifically, the determining section 440 determines the resistance value of the resistance element included in the second setting section 320, so that the value of the partial voltage of the control voltage will correspond to the driving voltage as a result of the operation of the second setting section 320.

Alternatively or additionally, the determining section 440 determines the circuit of the first setting section 310 according to the operating speed of the actuator. In an example, the determining section 440 determines the operating speed of the actuator 100 based on the measurement result concerning the conduction/non-conduction of the actuator 100 measured by the measuring section 430 with respect to the driving voltage in a pulse form supplied by the power source supply section 420. Next, the determining section 440 determines the circuit of the first setting section 310 based on the operating speed of the actuator 100. Specifically, the determining section 440 determines the value of the resistance element or the capacitance element included in the first setting section 310, so that the relaxation time of the first setting section 310 will have a predetermined value according to the operating speed.

In this way, the test apparatus 400 according to the above-described embodiment can determine the circuit for the control section 300 which drives the actuator 100, while testing the operation of the actuator 100.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An actuator apparatus comprising:
   an actuator that is provided with:
      a driving voltage at one end and a reference potential at the other end to enable driving;
      a first setting section that is connected to the one end of the actuator and sets an operating speed of the actuator; and
      a second setting section that is provided between the one end of the actuator and the reference potential, and adjusts a resistance of the second setting section to set the driving voltage of the actuator;
   wherein the actuator includes:
      a first contact;
      a second contact opposing the first contact; and
      a piezoelectric film that expands and contracts according to the driving voltage,
      such that the actuator is a switch that moves the second contact by expansion and contraction of the piezoelectric film to contact or separate the second contact and the first contact.

2. The actuator apparatus according to claim 1, further comprising:
   an input terminal through which a control voltage is applied from outside, wherein
   the first setting section includes a first resistance element connected between the input terminal and the one end of the actuator.

3. The actuator apparatus according to claim 1, wherein
   the second setting section includes a second resistance element connected between the one end of the actuator and the reference potential.

4. The actuator apparatus according to claim 2, wherein
   the first setting section includes at least one resistance element, and sets, to be the first resistance element, a resistance element selected according to the operating speed of the actuator.

5. The actuator apparatus according to claim 1, wherein
   the second setting section includes at least one resistance element, and sets a resistance element selected according to a default displacement amount of the actuator, to be a second resistance element connected between the one end of the actuator and the reference potential.

6. The actuator apparatus according to claim 1, wherein
   at least one of the first setting section and the second setting section includes a resistance element whose resistance value has been adjusted by trimming.

7. The actuator apparatus according to claim 1, wherein
the first setting section includes a capacitance element connected between the one end of the actuator and the reference potential.

8. The actuator apparatus according to claim 7, wherein
the first setting section includes at least one capacitance element, and connects a capacitance element selected according to the operating speed of the actuator between the one end of the actuator and the reference potential.

9. The actuator apparatus according to claim 1, further comprising:
a mounting substrate on which the actuator is mounted, wherein
at least one of the first setting section and the second setting section is provided on the mounting substrate.

10. The actuator apparatus according to claim 1, wherein
the piezoelectric film is formed to have an internal stress oriented in a predetermined direction, and the actuator is displaced by default in a predetermined direction by the internal stress.

11. The actuator apparatus according to claim 1, further comprising:
a power source section that supplies, as a control voltage, a voltage equal to or greater than the driving voltage electrically connecting the first contact to the second contact, when a default displacement amount of the actuator is set to be zero.

12. A test apparatus for testing an actuator according to claim 1, comprising:
a measuring section that is connected to the actuator, and measures correspondence between the driving voltage of the actuator and electric connection between a first contact and a second contact; and
a determining section that determines a circuit for the second setting section according to the correspondence.

13. The test apparatus according to claim 12, wherein
the measuring section measures the operating speed of the actuator, and
the determining section determines a circuit for the first setting section according to the operating speed of the actuator.

14. A test method for testing the actuator according to claim 1, comprising:
measuring correspondence between the driving voltage of the actuator and electric connection between a first contact and a second contact; and
determining a circuit for the second setting section according to the correspondence.

* * * * *